United States Patent
Wada et al.

(10) Patent No.: US 9,777,404 B2
(45) Date of Patent: Oct. 3, 2017

(54) METHOD FOR MANUFACTURING SILICON CARBIDE EPITAXIAL SUBSTRATE, AND SILICON CARBIDE EPITAXIAL SUBSTRATE

(71) Applicant: Sumitomo Electric Industries, Ltd., Osaka-shi (JP)

(72) Inventors: Keiji Wada, Itami (JP); Taro Nishiguchi, Itami (JP); Jun Genba, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/114,017

(22) PCT Filed: May 21, 2015

(86) PCT No.: PCT/JP2015/064585
§ 371 (c)(1),
(2) Date: Jul. 25, 2016

(87) PCT Pub. No.: WO2016/075957
PCT Pub. Date: May 19, 2016

(65) Prior Publication Data
US 2016/0355949 A1    Dec. 8, 2016

(30) Foreign Application Priority Data
Nov. 12, 2014    (JP) .................................. 2014-230005

(51) Int. Cl.
*D06N 7/04*    (2006.01)
*C30B 29/36*    (2006.01)
(Continued)

(52) U.S. Cl.
CPC ............ *C30B 29/36* (2013.01); *C23C 16/325* (2013.01); *C23C 16/45523* (2013.01);
(Continued)

(58) Field of Classification Search
CPC .......... C30B 29/36; C30B 25/14; C30B 25/20; C23C 16/325; C23C 16/45523; C23C 16/46; H01L 21/02529; H01L 21/0262
See application file for complete search history.

(56) References Cited

U.S. PATENT DOCUMENTS 5,279,701 A    1/1994  Shigeta et al.
8,609,513 B2 *  12/2013  Horii .................... H01L 21/6836
                                                      438/113

FOREIGN PATENT DOCUMENTS

JP    H01-286997 A    11/1989
JP    2005-508086 A    3/2005
(Continued)

OTHER PUBLICATIONS

JP 2009256138 A; machine translation.*
(Continued)

*Primary Examiner* — Maria Veronica Ewald
*Assistant Examiner* — Travis Figg
(74) *Attorney, Agent, or Firm* — Venable LLP; Michael A. Sartori; Laura G. Remus

(57) ABSTRACT

A method for manufacturing a silicon carbide epitaxial substrate includes: a step of placing a silicon carbide single crystal substrate within a chamber and reducing a pressure within the chamber; a step of increasing a temperature within the chamber to a first temperature; a step of introducing hydrogen gas into the chamber and adjusting the pressure within the chamber; a step of introducing hydrocarbon gas into the chamber; a substrate reforming step of increasing the temperature within the chamber to a second temperature and holding the temperature at the second temperature for a predetermined time, with the adjusted pressure within the chamber and a flow rate of the hydrogen gas being maintained and the hydrocarbon gas being introduced; and a step of growing an epitaxial layer on the silicon (Continued)

carbide single crystal substrate by introducing silane gas into the chamber with the second temperature being maintained.

4 Claims, 12 Drawing Sheets

(51) Int. Cl.
    *C30B 25/14*     (2006.01)
    *C23C 16/32*     (2006.01)
    *C23C 16/455*    (2006.01)
    *C23C 16/46*     (2006.01)
    *C30B 25/20*     (2006.01)
    *H01L 21/02*     (2006.01)

(52) U.S. Cl.
    CPC .............. *C23C 16/46* (2013.01); *C30B 25/14* (2013.01); *C30B 25/20* (2013.01); *H01L 21/0262* (2013.01); *H01L 21/02378* (2013.01); *H01L 21/02433* (2013.01); *H01L 21/02529* (2013.01)

(56) References Cited

FOREIGN PATENT DOCUMENTS

| JP | 2009-256138 A | | 11/2009 |
|---|---|---|---|
| JP | 2009256138 A | * | 11/2009 |
| JP | 2010-095431 A | | 4/2010 |
| JP | 2013-034007 A | | 2/2013 |
| WO | WO-03/038876 A1 | | 5/2003 |

OTHER PUBLICATIONS

Matsuhata et al. ("Gate oxide reliability on trapezoid-shaped defects and obtuse triangular defects in 4H-SiC epitaxial wafers" Japanese Journal of Applied Physics, Mar. 2014, 53; machine translation provided by Applicant.*
JP 2009-256138 A; machine translation.*
Matsuhata et al. ("Gate oxide reliability on trapezoid-shaped defects and obtuse triangular defects in 4H-SiC epitaxial wafers" Japanese Journal of Applied Physics, Mar. 2014, 53.*
International Search Report in International Application No. PCT/JP2015/064585, dated Aug. 25, 2015.
Notice of Grounds of Rejection in Japanese Patent Application No. 2015-554915, dated Dec. 15, 2015.
Notice of Grounds of Rejection in Japanese Patent Application No. 2015-554915, dated Feb. 9, 2016.
Ishiyama et al., "Gate oxide reliability on trapezoid-shaped defects and obtuse triangular defects in 4H-SiC epitaxial wafers," Japanese Journal of Applied Physics 53, Mar. 25, 2014.
Kitabatake, "Comprehensive Evaluation Platform for SiC Single Crystal Wafers," Engineering Materials, vol. 62, No. 3, Mar. 2014.
Decision to Grant Patent in Japanese Patent Application No. 2015-554915, dated May 24, 2016.

* cited by examiner

METHOD FOR MANUFACTURING SILICON CARBIDE EPITAXIAL SUBSTRATE, AND SILICON CARBIDE EPITAXIAL SUBSTRATE

TECHNICAL FIELD

The present disclosure relates to a method for manufacturing a silicon carbide epitaxial substrate, and a silicon carbide epitaxial substrate.

BACKGROUND ART

Japanese Patent Laying-Open No. 2013-34007 (PTD 1) describes a silicon carbide (SiC) epitaxial wafer having a SiC epitaxial layer grown on a SiC single crystal substrate inclined by an off angle of 0.4° to 5°, characterized by having no short step bunching.

CITATION LIST

Patent Document

PTD 1: Japanese Patent Laying-Open No. 2013-34007

SUMMARY OF INVENTION

Technical Problem

An object of the present disclosure is to provide a silicon carbide epitaxial substrate with reduced defects having a trapezoidal planar shape (hereinafter referred to as "trapezoidal defects").

Solution To Problem

A method for manufacturing a silicon carbide epitaxial substrate in accordance with one aspect of the present disclosure includes: a step of preparing a silicon carbide single crystal substrate; a step of placing the silicon carbide single crystal substrate within a chamber of a film forming device and reducing a pressure within the chamber; a step of increasing a temperature within the chamber to a first temperature; a step of introducing hydrogen gas into the chamber and adjusting the pressure within the chamber; a step of introducing hydrocarbon gas into the chamber; a substrate reforming step of increasing the temperature within the chamber to a second temperature and holding the temperature at the second temperature for a predetermined time, with the adjusted pressure within the chamber and a flow rate of the hydrogen gas being maintained and the hydrocarbon gas being introduced; and a step of growing an epitaxial layer on the silicon carbide single crystal substrate by introducing silane gas into the chamber with the second temperature being maintained.

A silicon carbide epitaxial substrate in accordance with one aspect of the present disclosure includes a silicon carbide single crystal substrate having an off angle of more than or equal to 1° and less than or equal to 8°, and an epitaxial layer formed on the silicon carbide single crystal substrate. In a surface of the epitaxial layer, trapezoidal defects, which are trapezoidal depressions, have a defect density of less than or equal to $1/cm^2$. The trapezoidal defects each include an upper base portion and a lower base portion intersecting with a <11-20> direction when viewed in plan view. The upper base portion has a width of more than or equal to 0.1 μm and less than or equal to 100 μm. The lower base portion has a width of more than or equal to 50 μm and less than or equal to 5000 μm. The upper base portion includes a protruding portion. The lower base portion includes a plurality of step bunchings.

Advantageous Effects of Invention

According to the above description, a silicon carbide epitaxial substrate with a reduced defect density of trapezoidal defects is provided.

DESCRIPTION OF EMBODIMENTS

[Description of Embodiment of Present Disclosure]

Figure 1:
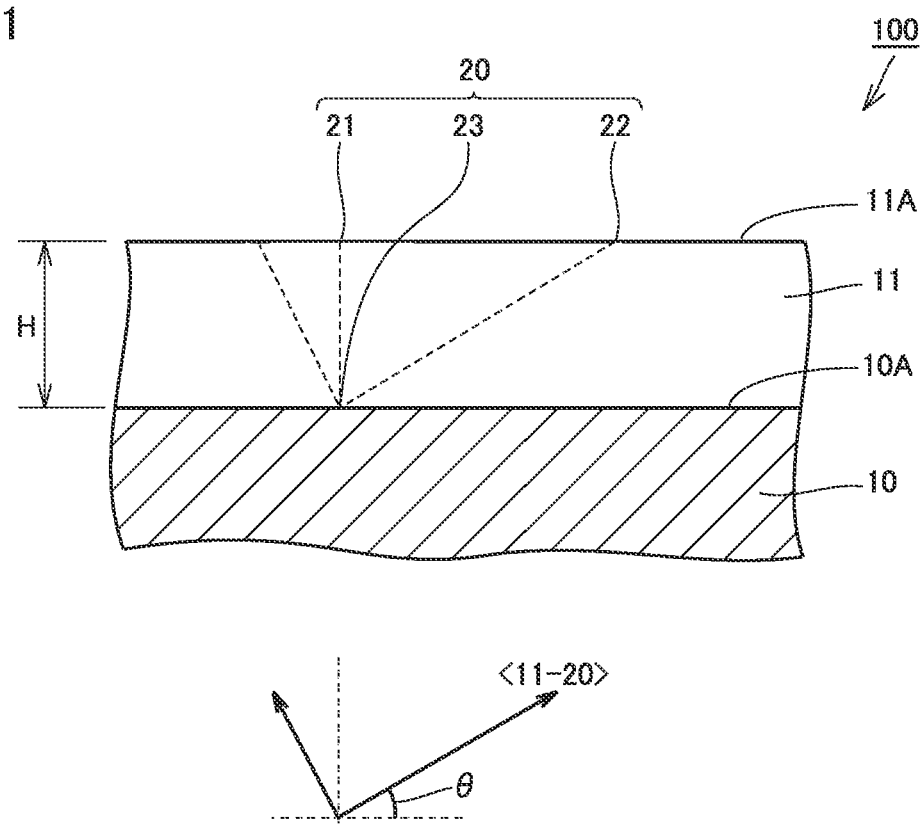
FIG. 1 is a schematic partial cross sectional view showing an example of a configuration of a silicon carbide epitaxial substrate in accordance with one aspect of the present disclosure.

First, an embodiment of the present disclosure will be described in list form. In the description below, identical or corresponding elements will be designated by the same reference numerals, and the same description thereof will not be repeated. Further, regarding crystallographic indications in the present specification, an individual orientation is represented by [], a group orientation is represented by <>, an individual plane is represented by ( ) and a group plane is represented by {}. Generally, a negative index is supposed to be crystallographically indicated by putting "-" (bar) above a numeral, but is indicated by putting the negative sign before the numeral in the present specification. In addition, "plan view" refers to a field of view when a surface of an epitaxial layer is viewed in a direction of a normal thereto.

[1] A method for manufacturing a silicon carbide epitaxial substrate in accordance with one aspect of the present disclosure includes: a step of preparing a silicon carbide single crystal substrate; a step of placing the silicon carbide single crystal substrate within a chamber of a film forming device and reducing a pressure within the chamber; a step of increasing a temperature within the chamber to a first temperature; a step of introducing hydrogen gas into the chamber and adjusting the pressure within the chamber; a step of introducing hydrocarbon gas into the chamber; a substrate reforming step of increasing the temperature within the chamber to a second temperature and holding the temperature at the second temperature for a predetermined time, with the adjusted pressure within the chamber and a flow rate of the hydrogen gas being maintained and the hydrocarbon gas being introduced; and a step of growing an epitaxial layer on the silicon carbide single crystal substrate by introducing silane gas into the chamber with the second temperature being maintained.

According to the study of the present inventor, a trapezoidal defect may have an origin in the vicinity of a growth interface between the silicon carbide single crystal substrate and the epitaxial layer, and extends from the origin to a surface of the epitaxial layer as the epitaxial layer grows. Conventionally, it is common to perform etching using hydrogen gas on a main surface of the silicon carbide single crystal substrate immediately before epitaxial growth. This is based on an idea of cleaning the main surface to suppress generation of defects. However, the present inventor has thought that the etching using hydrogen gas cannot fully suppress generation of the origin of the trapezoidal defect described above, made studies on a processing condition which replaces the conventional etching, and finally completed the manufacturing method described above.

Accordingly, the manufacturing method described above includes the substrate reforming step before the step of growing the epitaxial layer on the silicon carbide single crystal substrate. The substrate reforming step brings the silicon carbide single crystal substrate into contact with the hydrocarbon gas under specific conditions. That is, in the substrate reforming step, the main surface of the silicon carbide single crystal substrate is reformed by introducing the hydrogen gas into the chamber of the film forming device and adjusting the pressure as well as introducing the hydrocarbon gas, and increasing the temperature to a growth temperature (the second temperature) with the flow rate of the hydrogen gas and the pressure within the chamber being maintained.

According to this manufacturing method, the defect density of trapezoidal defects in the surface of the epitaxial layer can be controlled to less than or equal to $1/cm^2$, for example.

[2] Preferably, the hydrocarbon gas includes one or more types selected from the group consisting of methane gas, ethane gas, propane gas, butane gas, and acetylene gas, because a great reforming effect can be expected in a single gas or a mixed gas of these hydrocarbon gases.

[3] Preferably, the flow rate of the hydrocarbon gas in the step of introducing is more than or equal to 5 sccm and less than or equal to 30 sccm. Here, the unit "sccm (Standard Cubic Centimeter per Minute)" of the flow rate represents "mL/min" in a standard state (0° C., 101.3 kPa).

[4] Preferably, the flow rate of the hydrogen gas in the step of adjusting is more than or equal to 50 slm and less than or equal to 200 slm. Here, the unit "slm (Standard Liter per Minute)" of the flow rate represents "L/min" in the standard state described above.

[5] Preferably, the first temperature is more than or equal to 1300° C. and less than 1500° C., and the second temperature is more than or equal to 1500° C. and less than or equal to 1700° C.

[6] Preferably, the pressure within the chamber in the substrate reforming step is more than or equal to 5 kPa and less than or equal to 40 kPa (more than or equal to 50 mbar and less than or equal to 400 mbar).

[7] A method for manufacturing a silicon carbide epitaxial substrate in accordance with one aspect of the present disclosure includes: a step of preparing a silicon carbide single crystal substrate; a step of placing the silicon carbide single crystal substrate within a chamber of a film forming device and reducing a pressure within the chamber; a step of increasing a temperature within the chamber to a first temperature which is more than or equal to 1300° C. and less than 1500° C.; a step of introducing hydrogen gas having a flow rate of more than or equal to 50 slm and less than or equal to 200 slm into the chamber and adjusting the pressure within the chamber to more than or equal to 5 kPa and less than or equal to 40 kPa; a step of introducing propane gas having a flow rate of more than or equal to 5 sccm and less than or equal to 30 sccm into the chamber; a substrate reforming step of increasing the temperature within the chamber to a second temperature which is more than or equal to 1500° C. and less than or equal to 1700° C. and holding the temperature at the second temperature for a predetermined time, with the adjusted pressure within the chamber and the flow rate of the hydrogen gas being maintained and the propane gas being introduced; and a step of growing an epitaxial layer on the silicon carbide single crystal substrate by introducing silane gas into the chamber with the second temperature being maintained.

According to this manufacturing method, trapezoidal defects can be reduced.

A silicon carbide epitaxial substrate in accordance with one aspect of the present disclosure includes a silicon carbide single crystal substrate having an off angle of more than or equal to 1° and less than or equal to 8°, and an epitaxial layer formed on the silicon carbide single crystal substrate. In a surface of the epitaxial layer, trapezoidal defects have a defect density of less than or equal to $1/cm^2$. The trapezoidal defects each include an upper base and a lower base intersecting with a <11-20> direction when viewed in plan view. The upper base has a width of more than or equal to 0.1 μm and less than or equal to 100 μm, and the lower base has a width of more than or equal to 50 μm and less than or equal to 5000 μm.

By controlling the defect density of trapezoidal defects to less than or equal to $1/cm^2$ using the manufacturing method described above in [1] to [7],for example, the reliability of an oxide film can be improved in a semiconductor device manufactured using the silicon carbide epitaxial substrate.

Here, the "defect density of trapezoidal defects" can be calculated by analyzing the entire surface of the epitaxial layer at a magnification of 50 times to 400 times using a Nomarski-type optical microscope (for example, "MX-51" manufactured by Olympus Corporation), and dividing the number of the detected trapezoidal defects by the area of the surface of the epitaxial layer. It should be noted that generally the entire surface used herein does not include a region which is not utilized for a semiconductor device. Here, the region which is not utilized for a semiconductor device refers to, for example, a region of 3 mm from edges of a substrate.

[8] Further, when seen from another viewpoint, the silicon carbide epitaxial substrate described above includes the following configuration. That is, the silicon carbide epitaxial substrate includes a silicon carbide single crystal substrate having an off angle of more than or equal to 1° and less than or equal to 8°, and an epitaxial layer formed on the silicon carbide single crystal substrate. In a surface of the epitaxial layer, trapezoidal defects, which are trapezoidal depressions, have a defect density of less than or equal to $1/cm^2$. The trapezoidal defects each include an upper base portion and a lower base portion intersecting with a <11-20> direction when viewed in plan view. The upper base portion has a width of more than or equal to 0.1 μm and less than or equal to 100 μm. The lower base portion has a width of more than or equal to 50 μm and less than or equal to 5000 μm. The upper base portion includes a protruding portion. The lower base portion includes a plurality of step bunchings.

[9] Preferably, a main surface of the silicon carbide single crystal substrate is a surface inclined relative to a {0001} plane by the off angle. When the main surface of the silicon carbide single crystal substrate is a surface inclined relative to a (0001) plane or a (000-1) plane by more than or equal to 1° and less than or equal to 8°, an epitaxial layer with less mixture of a different polytype may be achieved.

[10] Preferably, the silicon carbide single crystal substrate has a diameter of more than or equal to 100 mm, because it may contribute to a reduction in the manufacturing cost of semiconductor devices.

[11] The epitaxial layer may have a thickness of more than or equal to 5 μm and less than or equal to 30 μm.

A silicon carbide epitaxial substrate in accordance with one aspect of the present disclosure includes a silicon carbide single crystal substrate having a main surface inclined relative to a {0001} plane by more than or equal to 1° and less than or equal to 8° and having a diameter of more than or equal to 100 mm, and an epitaxial layer formed on the silicon carbide single crystal substrate and having a thickness of more than or equal to 5 μm and less than or equal to 30 μm. In a surface of the epitaxial layer, trapezoidal defects have a defect density of less than or equal to 1/cm². The trapezoidal defects each include an upper base and a lower base intersecting with a <11-20> direction when viewed in plan view. The upper base has a width of more than or equal to 0.1 μm and less than or equal to 100 μm, and the lower base has a width of more than or equal to 50 μm and less than or equal to 5000 μm.

[12] Further, when seen from another viewpoint, the silicon carbide epitaxial substrate described above includes the following configuration. That is, the silicon carbide epitaxial substrate includes a silicon carbide single crystal substrate having a main surface inclined relative to a {0001} plane by more than or equal to 1° and less than or equal to 8° and having a diameter of more than or equal to 100 mm, and an epitaxial layer formed on the silicon carbide single crystal substrate and having a thickness of more than or equal to 5 μm and less than or equal to 30 μm. In a surface of the epitaxial layer, trapezoidal defects, which are trapezoidal depressions, have a defect density of less than or equal to 1/cm². The trapezoidal defects each include an upper base portion and a lower base portion intersecting with a <11-20> direction when viewed in plan view. The upper base portion has a width of more than or equal to 0.1 μm and less than or equal to 100 μm. The lower base portion has a width of more than or equal to 50 μm and less than or equal to 5000 μm. The upper base portion includes a protruding portion. The lower base portion includes a plurality of step bunchings.

In a semiconductor device manufactured using the silicon carbide epitaxial substrate of the present disclosure, the reliability of an oxide film is expected to be improved.

[Details of Embodiment of Present Disclosure]

Hereinafter, one embodiment of the present disclosure (hereinafter referred to as the "present embodiment") will be described in detail, although the present embodiment is not limited to the description below.

[Method for Manufacturing Silicon Carbide Epitaxial Substrate]

Figure 5:
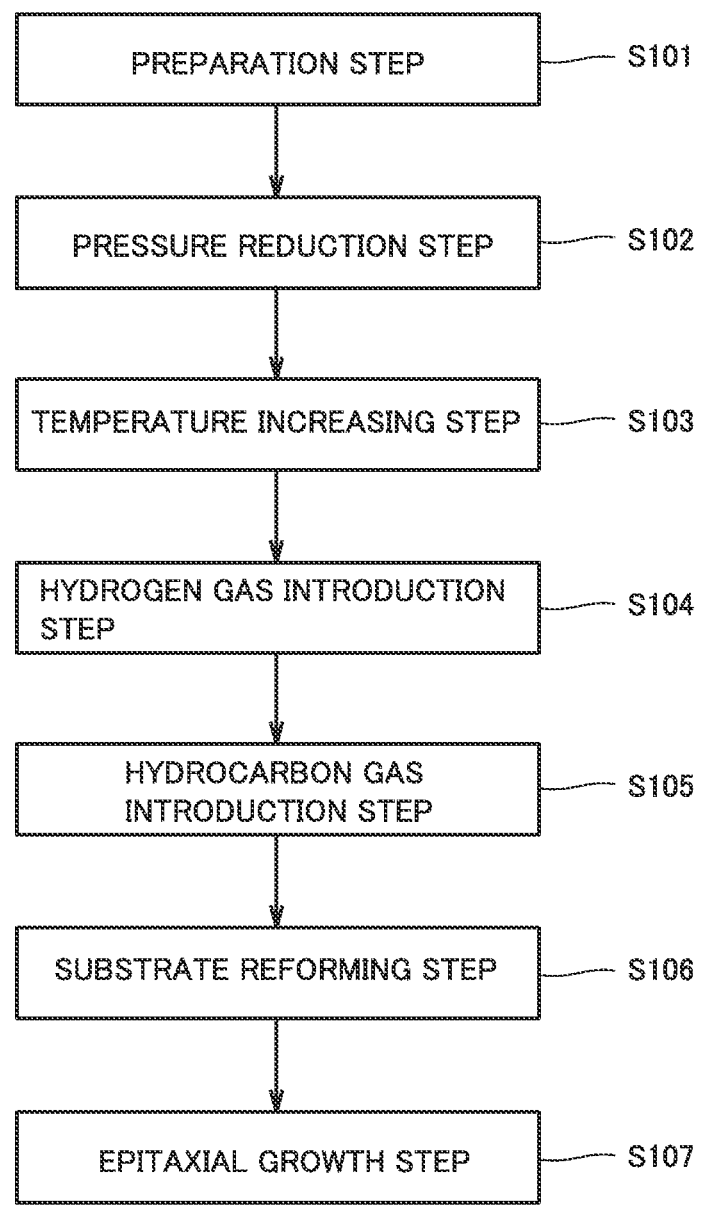
FIG. 5 is a flowchart schematically showing a method for manufacturing the silicon carbide epitaxial substrate in accordance with one aspect of the present disclosure.

FIG. 5 is a flowchart schematically showing a method for manufacturing a silicon carbide epitaxial substrate in the present embodiment. As shown in FIG. 5, the manufacturing method includes a preparation step (S101), a pressure reduction step (S102), a temperature increasing step (S103), a hydrogen gas introduction step (S104), a hydrocarbon gas introduction step (S105), a substrate reforming step (S106), and an epitaxial growth step (S107).

In the present embodiment, the substrate reforming step (S106) is performed before the epitaxial growth step (S107). Thereby, origins 23 of trapezoidal defects 20 are reduced in a silicon carbide single crystal substrate 10. As a result, the defect density of trapezoidal defects 20 in a surface 11A of an epitaxial layer 11 is reduced. Hereinafter, each step will be described.

[Preparation Step (S101)]

In the preparation step (S101), silicon carbide single crystal substrate 10 shown in FIG. 1 is prepared. Silicon carbide single crystal substrate 10 is prepared for example by slicing an ingot made of a silicon carbide single crystal. For slicing, a wire saw is used, for example. Silicon carbide desirably has a polytype of 4H, because it is more excellent in electron mobility, dielectric strength, and the like than other polytypes. Silicon carbide single crystal substrate 10 has a diameter of preferably more than or equal to 100 mm (for example, more than or equal to 4 inches), and more preferably more than or equal to 150 mm (for example, more than or equal to 6 inches). Having a larger diameter may contribute to a reduction in the manufacturing cost of semiconductor devices.

Silicon carbide single crystal substrate 10 has a main surface 10A on which epitaxial layer 11 will be grown later. Silicon carbide single crystal substrate 10 has an off angle θ of more than or equal to 1° and less than or equal to 8°. That is, main surface 10A is a surface inclined relative to a predetermined crystal plane by off angle θ of more than or equal to 1° and less than or equal to 8°. By providing off angle θ to silicon carbide single crystal substrate 10, when epitaxial layer 11 is grown by a CVD method, lateral growth from an atomic step exposed in main surface 10A, that is, "step-flow growth" is induced. Thereby, a single crystal grows with the polytype of silicon carbide single crystal substrate 10 being maintained, and mixture of a different polytype is suppressed. Here, the predetermined crystal plane is preferably a (0001) plane or a (000-1) plane. That is, the predetermined crystal plane is preferably a {0001} plane. The direction in which the off angle is provided is desirably a <11-20> direction. Off angle θ is more preferably more than or equal to 2° and less than or equal to 7°, particularly preferably more than or equal to 3° and less than or equal to 6°, and most preferably more than or equal to 3° and less than or equal to 5°, because the balance between the suppression of a different polytype and the growth speed is maintained by setting the off angle to be in such a range.

[Film Forming Device]

Figure 3:
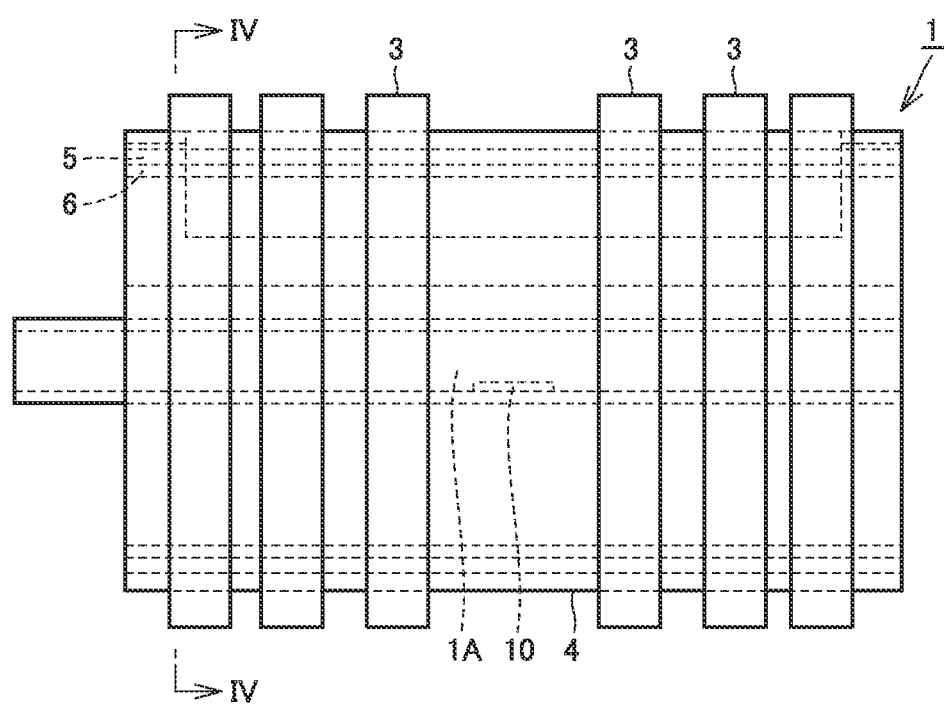
FIG. 3 is a schematic side view showing an example of a configuration of a film forming device.
Figure 4:
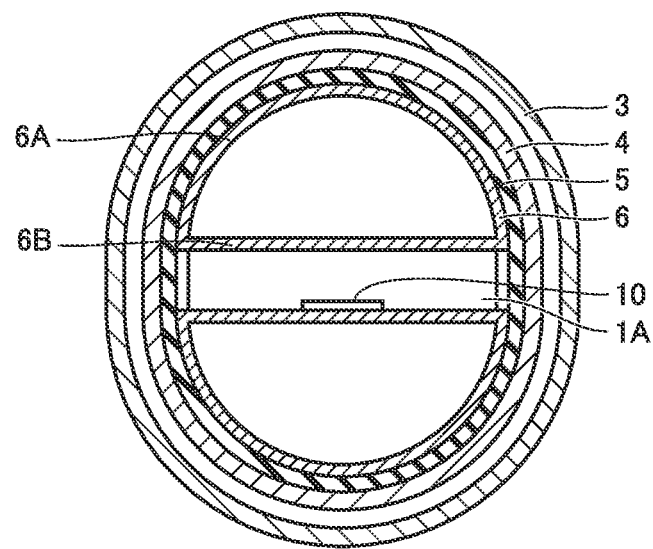
FIG. 4 is a schematic cross sectional view taken along a line IV-IV in FIG. 3.

The steps after the preparation step (S101) are performed within a film forming device. Thus, the configuration of the film forming device will be described first. FIG. 3 is a schematic side view showing an example of the configuration of the film forming device. FIG. 4 is a schematic cross sectional view taken along a line IV-IV in FIG. 3. A film forming device 1 shown in FIGS. 3 and 4 is a lateral hot-wall CVD device. As shown in FIG. 3, film forming device 1 includes heating elements 6, a heat insulator 5, a quartz tube 4, and an induction heating coil 3. Heating elements 6 are made of carbon, for example. As shown in FIG. 4, film forming device 1 is provided with two heating elements 6, and each heating element 6 has a semi-cylindrical hollow structure including a curved portion 6A and a flat portion 6B.

Two flat portions 6B are arranged to face each other, and a space surrounded by two flat portions 8 serves as a chamber 1A in which silicon carbide single crystal substrate 10 is placed. Chamber 1A is also referred to as a "gas flow channel".

Heat insulator 5 is arranged to surround outer circumference portions of heating elements 6. Chamber 1A is insulated by heat insulator 5 from the outside of film forming device 1. Quartz tube 4 is arranged to surround an outer circumference portion of heat insulator 5. Induction heating coil 3 is wound along an outer circumference portion of quartz tube 4. Film forming device 1 is configured such that heating elements 6 are induction-heated by supplying an alternating current to induction heating coil 3, and thereby the temperature within chamber 1A can be controlled. On this occasion, quartz tube 4 is hardly heated by the function of heat insulator 5.

[Pressure Reduction Step (S102)]

In the pressure reduction step (S102), as shown in FIGS. 3 and 4, silicon carbide single crystal substrate 10 is placed within chamber 1A of film forming device 1, and the pressure within chamber 1A is reduced. Silicon carbide single crystal substrate 10 is placed on a susceptor not shown within chamber 1A. The susceptor may be subjected to SiC coating or the like.

Figure 6:
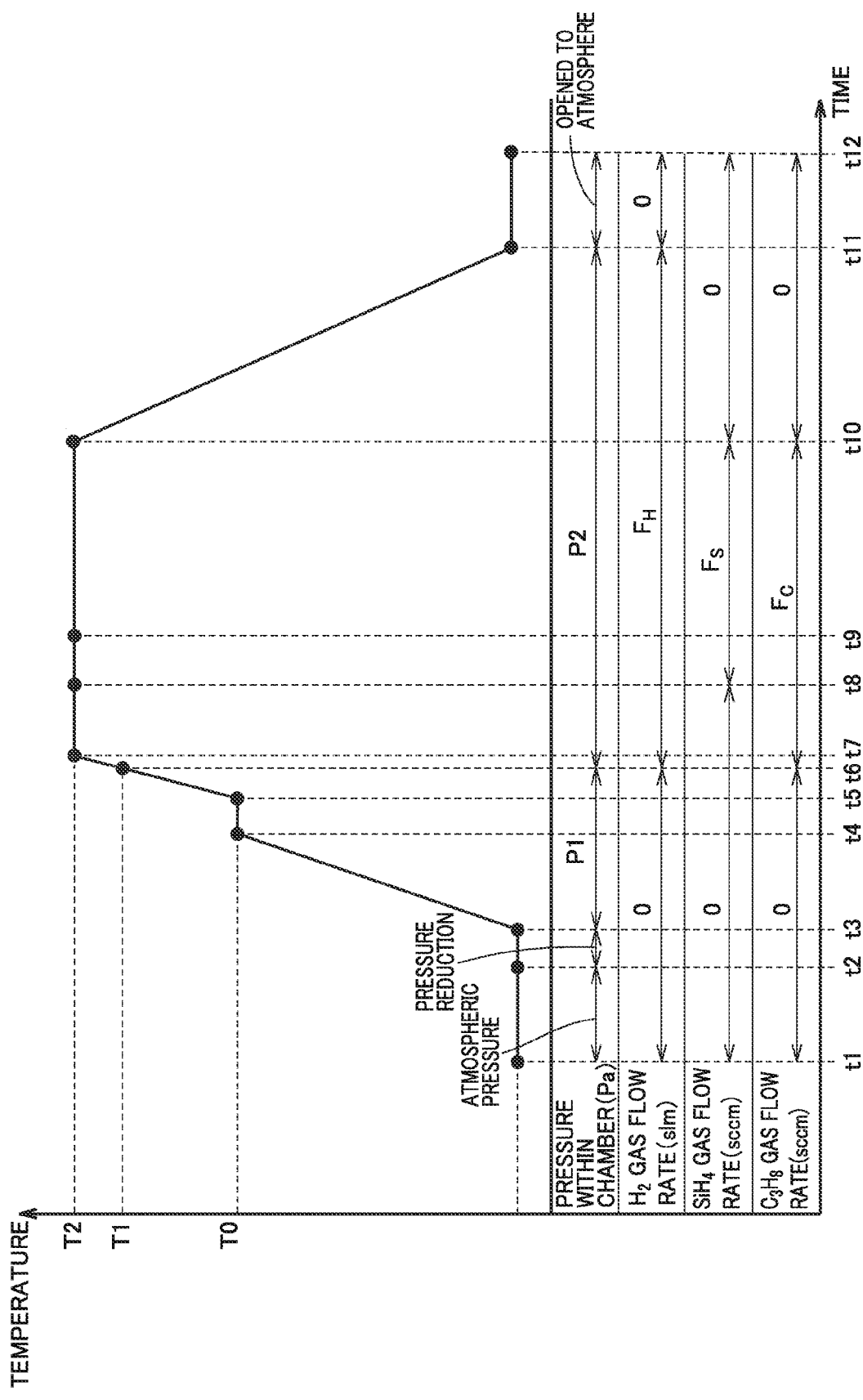
FIG. 6 is a timing chart showing an example of temperature control and gas flow rate control within the film forming device.

FIG. 6 is a timing chart showing control of the temperature and the gas flow rate within chamber 1A in and after the pressure reduction step (S102). In FIG. 6, the pressure reduction step (S102) corresponds to a time from a time point t1 at which silicon carbide single crystal substrate 10 is placed within chamber 1A, through a time point t2 at which pressure reduction within chamber 1A is started, to a time point t3 at which the pressure within chamber 1A reaches a target value (pressure P1). Pressure P1 is about $1 \times 10^{-6}$ Pa, for example.

[Temperature Increasing Step (S103)]

In the temperature increasing step (S103), the temperature within chamber 1A of film forming device 1 is heated to a first temperature T1. As shown in FIG. 6, temperature increase within chamber 1A is started from time point t3, and the temperature within chamber 1A reaches first temperature T1 at a time point t6. The temperature increase up to first temperature T1 may be performed in a single step, or may be performed in a stepwise manner for example by providing a time for holding a predetermined temperature T0 (from a time point t4 to a time point t5 in FIG. 6) in the course of the temperature increase. The holding time at temperature T0 is about 10 minutes, for example.

First temperature T1 is preferably more than or equal to 1300° C. and less than 1500° C. If first temperature T1 is less than 1300° C., silicon carbide single crystal substrate 10 will be brought into contact with hydrogen gas and hydrocarbon gas at a temperature less than 1300° C. in the substrate reforming step (S106) performed later, and generation of defects other than trapezoidal defects may be stimulated. On the other hand, if first temperature T1 is more than or equal to 1500° C., there is only a small temperature difference between first temperature T1 and a second temperature T2, and the reforming effect may be reduced. First temperature T1 is more preferably more than or equal to 1320° C. and less than or equal to 1480° C., and particularly preferably more than or equal to 1350° C. and less than or equal to 1450° C. Further, in view of the relation with second temperature T2 described later, first temperature T1 is desirably lower than second temperature T2 by about 100° C. to 200° C. A temperature increasing time (a time from time point t3 to time point t6) is about 30 minutes to 2 hours, for example.

[Hydrogen Gas Introduction Step (S104)]

As shown in FIG. 6, from time point t6 at which the temperature within chamber 1A reaches first temperature T1, hydrogen ($H_2$) gas is introduced into chamber 1A, and the pressure within chamber 1A is adjusted to a pressure P2.

In the hydrogen gas introduction step (S104), pressure P2 within chamber 1A is preferably adjusted to more than or equal to 5 kPa and less than or equal to 40 kPa, because a great reforming effect can be expected at a pressure within such a range. Pressure P2 within chamber 1A in the hydrogen gas introduction step (S104) is more preferably adjusted to more than or equal to 5 kPa and less than or equal to 15 kPa (more than or equal to 50 mbar and less than or equal to 150 mbar), and particularly preferably adjusted to more than or equal to 7.5 kPa and less than or equal to 12.5 kPa (more than or equal to 75 mbar and less than or equal to 125 mbar).

The flow rate of the hydrogen gas ($F_H$ in FIG. 6) is preferably more than or equal to 50 slm and less than or equal to 200 slm. If the flow rate of the hydrogen gas is less than 50 slm, the ratio of the flow rate of the hydrocarbon gas to the total gas flow rate becomes too high, and generation of defects other than trapezoidal defects may be stimulated. On the other hand, if the flow rate of the hydrogen gas is more than 200 slm, the ratio of the flow rate of the hydrocarbon gas to the total gas flow rate becomes too low, and the reforming effect may be reduced. The flow rate of the hydrogen gas is more preferably more than or equal to 75 slm and less than or equal to 175 slm, and particularly preferably more than or equal to 100 slm and less than or equal to 150 slm.

[Hydrocarbon Gas Introduction Step (S105)]

As shown in FIG. 6, at time point t6, the hydrocarbon gas introduction step (S105) is started in parallel with the hydrogen gas introduction step (S104). However, the hydrogen gas introduction step (S104) and the hydrocarbon gas introduction step (S105) do not necessarily have to be started at the same timing, and these steps may be started at somewhat deviated timings. For example, introduction of the hydrocarbon gas may be started after pressure adjustment using the hydrogen gas is completed. As the hydrocarbon gas, methane ($CH_4$) gas, ethane ($C_2H_6$) gas, propane ($C_3H_8$) gas, butane ($C_4H_{10}$) gas, acetylene ($C_2H_2$) gas, and the like can be used. These hydrocarbon gases may be used alone, or two or more types may be mixed and used. That is, the hydrocarbon gas preferably includes one or more types selected from the group consisting of methane gas, ethane gas, propane gas, butane gas, and acetylene gas. The flow rate of the hydrocarbon gas ($F_C$ in FIG. 6) in the hydrocarbon gas introduction step (S105) is preferably more than or equal to 5 sccm and less than or equal to 30 sccm, because a great reforming effect can be expected within this range. The flow rate of the hydrocarbon gas is more preferably more than or equal to 10 sccm and less than or equal to 25 sccm, and particularly preferably more than or equal to 15 sccm and less than or equal to 20 sccm.

Further, the ratio between the flow rate of the hydrocarbon gas and the flow rate of the hydrogen gas (the flow rate of the hydrocarbon gas÷the flow rate of the hydrogen gas) is preferably more than or equal to $2.5 \times 10^{-5}$ and less than or equal to $6.0 \times 10^{-4}$, more preferably more than or equal to $5.7 \times 10^{-5}$ and less than or equal to $3.3 \times 10^{-4}$, and particularly preferably more than or equal to $1.0 \times 10^{-4}$ and less than or equal to $2.0 \times 10^{-4}$.

[Substrate Reforming Step (S106)]

The substrate reforming step (S106) is started by increasing the temperature within chamber 1A from time point t6 at which the pressure within chamber 1A is adjusted to pressure P2 by introducing the hydrogen gas and the hydrocarbon gas is introduced. According to the study of the present inventor, origins of trapezoidal defects can be reduced by bringing silicon carbide single crystal substrate 10 into contact with the hydrocarbon gas from a temperature slightly lower than second temperature T2, which is a growth temperature.

As shown in FIG. 6, in the substrate reforming step (S106), the temperature within chamber 1A is increased from time point t6, reaches second temperature T2 at a time point t7, and is further held at second temperature T2 until a time point t8 (immediately before full-scale growth). On this occasion, reforming of silicon carbide single crystal substrate 10 is considered to be started when the temperature increase is started (at time point t6).

A processing time in the substrate reforming step (S106), that is, a time from time point t6 to time point t8, is preferably more than one minute, in order to achieve a great reforming effect. The time from time point t6 to time point t8 is more preferably more than or equal to 5 minutes, particularly preferably more than or equal to 10 minutes, and most preferably more than or equal to 15 minutes. On this occasion, a time from time point t6 to time point t7 (temperature increasing time) is preferably more than or equal to 10 seconds and less than or equal to 2 minutes, more preferably more than or equal to 20 seconds and less than or equal to 1 minute and 30 seconds, and particularly preferably more than or equal to 30 seconds and less than or equal to 1 minute. Further, a time from time point t7 to time point t8 (holding time) is preferably more than or equal to 1 minute and less than or equal to 60 minutes, more preferably more than or equal to 5 minutes and less than or equal to 40 minutes, and particularly preferably more than or equal to 10 minutes and less than or equal to 30 minutes.

Here, second temperature T2 is preferably more than or equal to 1500° C. and less than or equal to 1700° C. If second temperature T2 is less than 1500° C., it may be difficult to uniformly grow a single crystal in the epitaxial growth step (S107) performed later, and the growth speed may be reduced. Further, if second temperature T2 is more than 1700° C., an etching action using the hydrogen gas is enhanced, and the growth speed may be reduced contrarily. Second temperature T2 is more preferably more than or equal to 1520° C. and less than or equal to 1680° C., and particularly preferably more than or equal to 1550° C. and less than or equal to 1650° C.

In the substrate reforming step (S106), the flow rate of the hydrogen gas and the pressure within chamber 1A are held to be constant, whereas a temperature increasing speed from first temperature T1 to second temperature T2 does not have to be constant. Further, the flow rate of the hydrocarbon gas does not have to be constant, either.

[First Modification]

Figure 7:
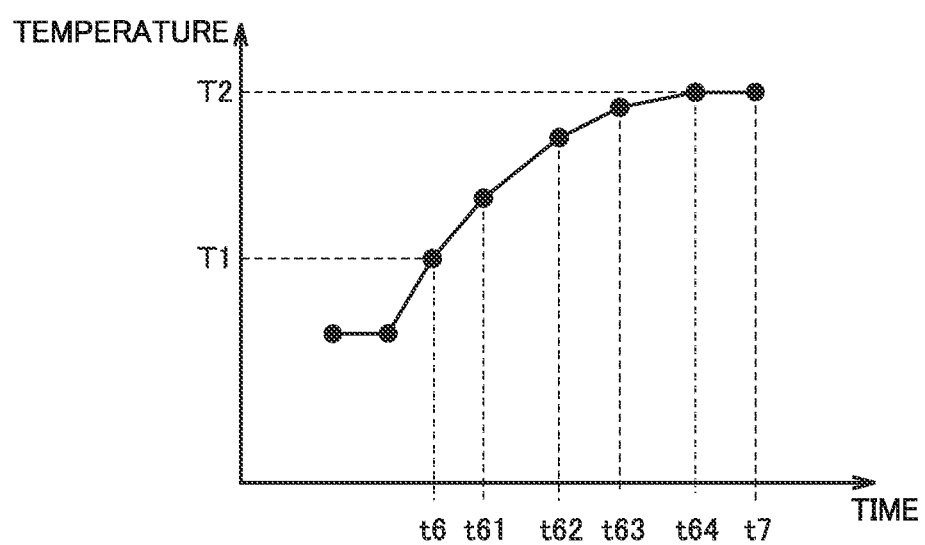
FIG. 7 is a partial timing chart showing a first modification of the timing chart of FIG. 6.

FIG. 7 is a partial timing chart showing a first modification of a temperature increasing method in the substrate reforming step (S106). As shown in FIG. 7, the temperature increase from first temperature T1 to second temperature T2 may be performed so as to gradually reduce the temperature increasing speed. For example, the temperature can be increased by 50° C. at each time point (such as a time point t61) between time points t6 and t7 in FIG. 7 while gradually increasing the interval between the time points. On this occasion, the flow rate of the hydrocarbon gas may be gradually increased according to the reduction of the temperature increasing speed. A time between the time points (for example, a time between time points t61 and t62) is more than or equal to about 1 second and less than or equal to about 30 seconds, for example.

[Second Modification]

Figure 8:
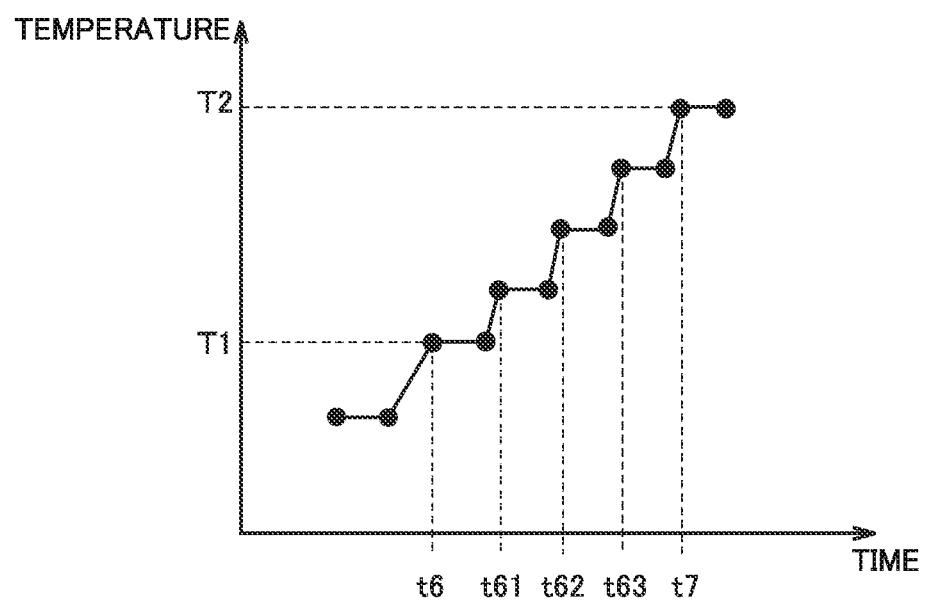
FIG. 8 is a partial timing chart showing a second modification of the timing chart of FIG. 6.

FIG. 8 is a partial timing chart showing a second modification of the temperature increasing method in the substrate reforming step (S106). As shown in FIG. 8, the temperature increase from first temperature T1 to second temperature T2 may be performed in a stepwise manner. For example, the temperature can be increased by 50° C. at each time point (such as time point t61) between time points t6 and t8 in FIG. 8, and can be set to be constant and held for a predetermined time after the temperature increase. Further, on this occasion, holding times may be set to be gradually longer. Furthermore, the flow rate of the hydrocarbon gas may be increased in a stepwise manner at each time point, according to the temperature increase. The holding time in each step is more than or equal to about 1 second and less than or equal to about 30 seconds, for example.

[Epitaxial Growth Step (S107)]

In the epitaxial growth step (S107), silane ($SiH_4$) gas is introduced with second temperature T2 being maintained, in addition to the hydrogen gas and the hydrocarbon gas which have already been introduced into chamber 1A. Thereby, epitaxial layer 11 can be grown on main surface 10A of silicon carbide single crystal substrate 10.

Although the flow rate of the silane gas ($F_S$ in FIG. 6) is not particularly limited in the epitaxial growth step (S107), it is desirable to adjust the flow rate of the silane gas such that the ratio of the number of carbon (C) atoms contained in the hydrocarbon gas to the number of silicon (Si) atoms contained in the silane gas (C/Si) is more than or equal to 0.5 and less than or equal to 2.0, in order to epitaxially grow SiC having an appropriate stoichiometric ratio.

In the epitaxial growth step (S107), nitrogen ($N_2$) or the like may be introduced as a dopant. On this occasion, a region in which the dopant is incorporated in a large amount may be formed in the early stage of growth (between time point t8 and a time point t9). Such a region is also referred to as a "buffer layer". The buffer layer has a doping concentration of about $1\times10^{-18}$ $cm^{-3}$, for example. The buffer layer has a thickness of about 0.1 to 1.0 µm, for example.

Epitaxial growth is continued until a time point t10, according to a target thickness of epitaxial layer 11. After the growth is finished, the temperature within chamber 1A is decreased toward a time point t11. Furthermore, at time point t11 and thereafter, the inside of chamber 1A is opened to the atmosphere, and the pressure within chamber 1A is returned to the atmospheric pressure (a time point t12). Thus, a silicon carbide epitaxial substrate 100 is manufactured.

[Silicon Carbide Epitaxial Substrate]

Hereinafter, silicon carbide epitaxial substrate 100 obtained by the manufacturing method in the present embodiment will be described.

FIG. 1 is a schematic cross sectional view showing an example of a configuration of silicon carbide epitaxial substrate 100. As shown in FIG. 1, silicon carbide epitaxial substrate 100 includes silicon carbide single crystal substrate 10 having main surface 10A inclined relative to the predetermined crystal plane by off angle θ, and epitaxial layer 11 formed on main surface 10A of silicon carbide single crystal substrate 10. As described above, the predetermined crystal plane is preferably a (0001) plane or a (000-1) plane.

[Trapezoidal Defects]

In silicon carbide epitaxial substrate 100, trapezoidal defects 20 in surface 11A of epitaxial layer 11 have a defect density of less than or equal to $1/cm^2$. Considering the reliability of an oxide film in a semiconductor device, it is desirable for trapezoidal defects 20 to have a lower defect density, and ideally, a defect density of 0 (zero). The defect density of trapezoidal defects 20 is preferably less than or equal to 0.5/cm$^2$, and more preferably less than or equal to 0.1/cm$^2$.

As shown in FIG. 1, trapezoidal defect 20 has origin 23 at an interface between silicon carbide single crystal substrate 10 and epitaxial layer 11, and extends to surface 11A of epitaxial layer 11. However, trapezoidal defect 20 does not necessarily have origin 23. That is, the trapezoidal defect in the present embodiment includes a defect having no origin, as long as it includes an upper base and a lower base, because the study of the present inventor has confirmed the presence of a trapezoidal defect whose origin cannot be observed.

Figure 2:
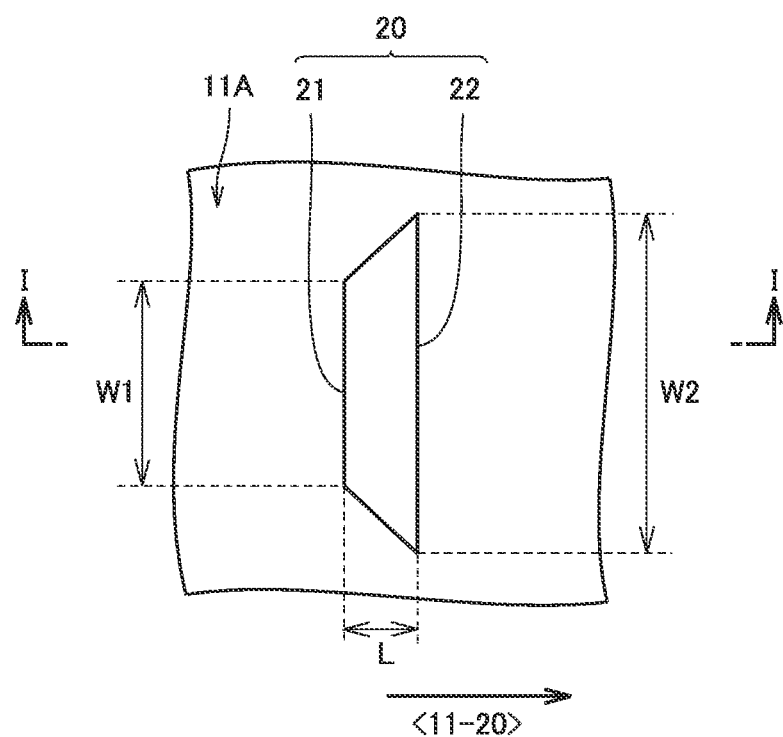
FIG. 2 is a schematic plan view showing an example of a trapezoidal defect.

FIG. 2 is a schematic plan view showing a planar shape of a trapezoidal defect. As shown in FIG. 2, trapezoidal defect 20 includes an upper base 21 and a lower base 22 intersecting with the <11-20> direction. In trapezoidal defect 20, upper base 21 has a width W1 of more than or equal to 0.1 μm and less than or equal to 100 μm, and lower base 22 has a width W2 of more than or equal to 50 μm and less than or equal to 5000 μm.

A thickness H of epitaxial layer 11 is preferably more than or equal to 5 μm and less than or equal to 30 μm. Silicon carbide epitaxial substrate 100 including epitaxial layer 11 with such a thickness is particularly useful as a substrate for a high breakdown voltage MOSFET, for example.

Figure 9:
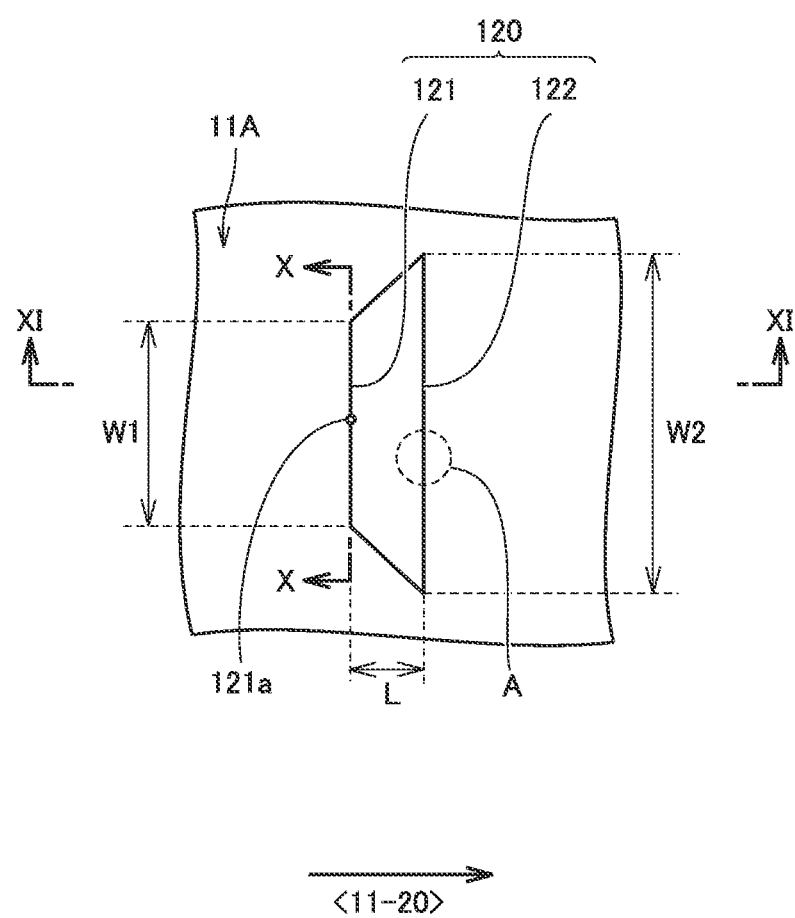
FIG. 9 is a schematic plan view showing another example of the trapezoidal defect.

FIG. 9 is a schematic plan view showing another example of the trapezoidal defect. A trapezoidal defect 120 is a depression formed in the surface of epitaxial layer 11, and has a trapezoidal planar shape. Trapezoidal defect 120 includes an upper base portion 121 and a lower base portion 122 intersecting with the <11-20> direction. Upper base portion 121 has width W1 of more than or equal to 0.1 μm and less than or equal to 100 μm, and lower base portion 122 has width W2 of more than or equal to 50 μm and less than or equal to 5000 μm.

Figure 10:
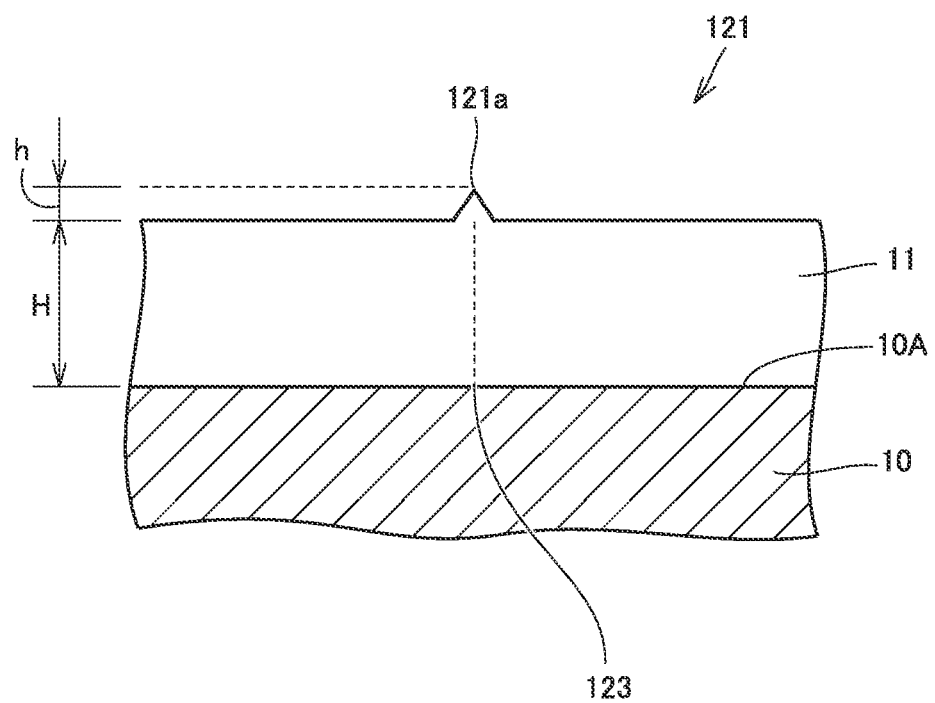
FIG. 10 is a schematic cross sectional view taken along a line X-X in FIG. 9.

FIG. 10 is a schematic cross sectional view taken along a line X-X in FIG. 9. As shown in FIG. 10, upper base portion 121 includes a protruding portion 121a. Protruding portion 121a may be located substantially at the center of upper base portion 121. In upper base portion 121, protruding portion 121a protrudes about 5 to 20 nm relative to a portion other than protruding portion 121a. The height of protruding portion 121a can be measured with a white light interferometric microscope (for example, "BW-D507" manufactured by Nikon Corporation). A mercury lamp is used as a light source for the white light interferometric microscope, and the field of view of the white interference microscope is set to 250 μm×250 μm.

Figure 11:
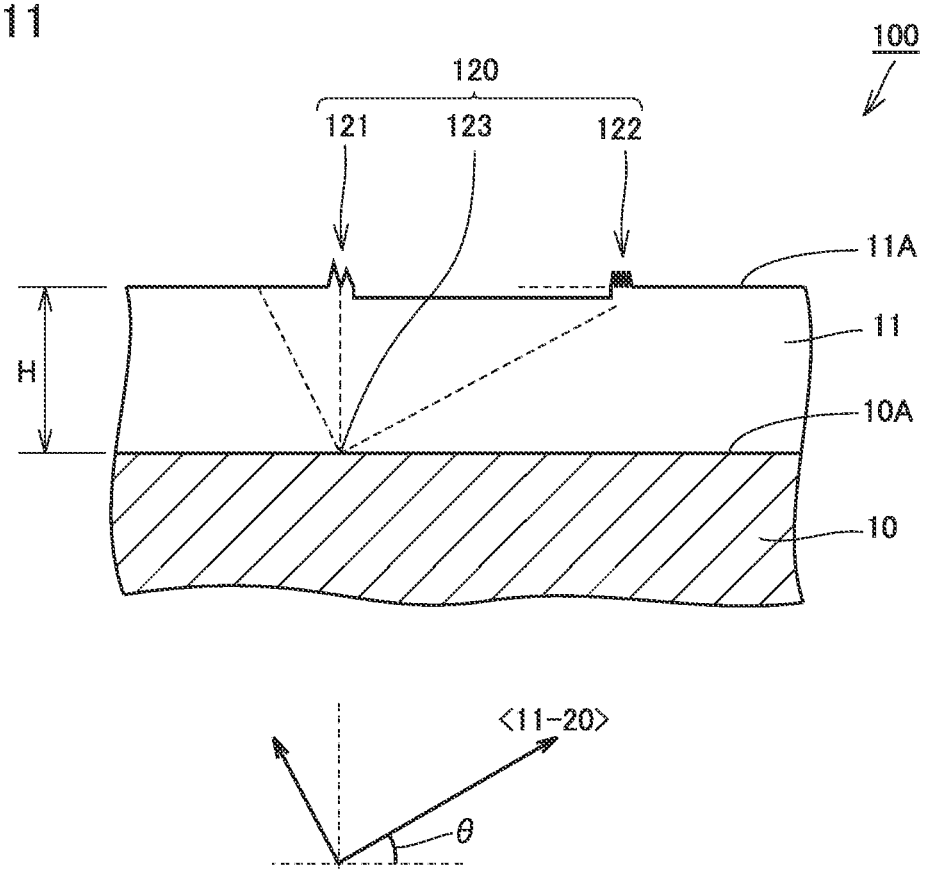
FIG. 11 is a schematic cross sectional view taken along a line XI-XI in FIG. 9.

FIG. 11 is a schematic cross sectional view taken along a line XI-XI in FIG. 9. Inside trapezoidal defect 120, that is, in a region between upper base portion 121 and lower base portion 122, the surface of epitaxial layer 11 slightly recedes toward silicon carbide single crystal substrate 10.

Trapezoidal defect 120 has an origin 123 at the interface between silicon carbide single crystal substrate 10 and epitaxial layer 11. Origin 123 may be connected with protruding portion 121a. However, protruding portion 121a is not connected with a threading dislocation.

Figure 12:
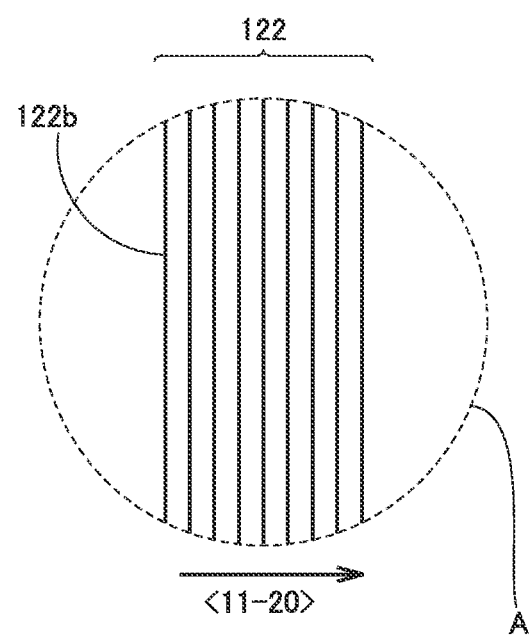
FIG. 12 is an enlarged view of a region A in FIG. 9.

FIG. 12 is an enlarged view of a region A in FIG. 9. As shown in FIG. 12, lower base portion 122 includes a plurality of step bunchings 122b. The "step bunching" refers to a linear defect in which a plurality of atomic steps form a bunch and produce a level difference of more than or equal to 1 nm. The size of the level difference in the step bunching may be about 1 to 5 nm, for example. The size of the level difference in the step bunching can be measured with an atomic force microscope (AFM), for example.

The number of the step bunchings included in lower base portion 122 may be, for example, about 2 to 100, or about 2 to 50. The number of the step bunchings included in lower base portion 122 can also be counted by observing lower base portion 122 with the AFM.

As the AFM, "Dimension 300" manufactured by Veeco or the like can be used, for example. As a cantilever (probe) for the AFM, "NCHV-10V" manufactured by Bruker or the like is suitable. Measurement conditions of the AFM are set as follows.

The measurement mode of the AFM is set to a tapping mode, and in the tapping mode, the measurement region is set to a square having each side of 20 μm and the measurement depth is set to 1.0 μm. Sampling in the tapping mode is performed under conditions that the scanning speed within the measurement region is set to 5 seconds for one cycle, the number of data for each scan line is set to 512 points, and the number of the scan lines is set to 512. Displacement control for the cantilever is set to 15.50 nm.

EXAMPLE

Hereinafter, the present embodiment will be described in more detail using an Example, although the present embodiment is not limited thereto.

Silicon carbide epitaxial substrates in accordance with samples 1, 2, and 3 were manufactured as described below to investigate the defect density of trapezoidal defects.

[Manufacturing of Samples 1 to 3]

Silicon carbide single crystal substrate 10 having main surface 10A inclined relative to a (0001) plane by 4° was prepared. Silicon carbide single crystal substrate 10 was placed within chamber 1A of film forming device 1, and epitaxial layer 11 having a thickness of 15 μm was grown thereon according to the timing chart of FIG. 6.

In order to manufacture samples 1 to 3, parameters shown in FIG. 6 were set as follows.

Pressure P1 within the chamber: 1×10$^{-6}$ Pa
Pressure P2 within the chamber: 10 kPa
Flow rate $F_H$ of the hydrogen gas: 120 slm
Flow rate $F_S$ of the silane gas: 46 sccm
Flow rate $F_C$ of the hydrocarbon gas: 17 sccm
Type of the hydrocarbon gas: propane gas
Temperature T0: 1100° C.
First temperature T1: 1400° C.
Second temperature T2: 1590° C.

As for sample 1, the flow rate of propane was set to 0 from time point t1 to time point t8 in FIG. 6, and was set to $F_C$ from time point t8 to time point t10. The temperature profile was set as in FIG. 6.

That is, as for sample 1, temperature increase to the growth temperature (second temperature T2) was not performed with the hydrocarbon gas being introduced, and the substrate reforming step (S106) was not performed. Sample 1 corresponds to an example where only etching using the hydrogen gas was performed, as in a conventional technique.

As for sample 2, propane gas was introduced from time point t6 in FIG. 6 (that is, in the course of increasing the temperature to the growth temperature). The time between time point t6 and time point t8 from which the silane gas was introduced (the processing time in the substrate reforming step) was set to 5 minutes.

As for sample 3, propane gas was introduced from time point t6 in FIG. 6. The time between time point t6 and time point t8 from which the silane gas was introduced was set to 15 minutes.

Defect densities of trapezoidal defects in the epitaxial layers of samples 1 to 3 were measured according to the method described above, using a Nomarski-type optical microscope. Table 1 shows the results.

TABLE 1

|  | Sample 1 | Sample 2 | Sample 3 |
|---|---|---|---|
| Substrate reforming step | No | 5 minutes | 15 minutes |
| Trapezoidal defects | 3.7/cm² | 0.1/cm² or less | 0/cm² |

It can be seen from Table 1 that, in samples 2 and 3 which were subjected to the substrate reforming step, the defect density of trapezoidal defects was significantly reduced, when compared with sample 1 which was not subjected to the substrate reforming step. In particular, in sample 3 for which the processing time in the substrate reforming step was set to 15 minutes, the defect density of trapezoidal defects was reduced to a state where the presence of trapezoidal defects was not able to be substantially confirmed.

It should be understood that the embodiment and example disclosed herein are illustrative and non-restrictive in every respect. The scope of the present invention is defined by the scope of the claims, rather than the embodiment and example described above, and is intended to include any modifications within the scope and meaning equivalent to the scope of the claims.

REFERENCE SIGNS LIST

1: film forming device; 1A: chamber; 3: induction heating coil; 4: quartz tube; 5: heat insulator; 6: heating element; 6A: curved portion; 6B: flat portion; 10: single crystal substrate; 10A: main surface; 11: epitaxial layer; 11A: surface; 20, 120: trapezoidal defect; 21: upper base; 22: lower base; 23, 123: origin; 100: silicon carbide epitaxial substrate; 121: upper base portion; 121a: protruding portion; 122: lower base portion; 122b: step bunching; h: height; A: region; $F_C$, $F_H$, $F_S$: flow rate; H: thickness; L: interval; P1, P2: pressure; T0: temperature; T1: first temperature; T2: second temperature; W1, W2: width; t1, t2, t3, t4, t5, t6, t7, t8, t9, t10, t11, t12, t61, t62, t63, t64: time point.

The invention claimed is:

1. A silicon carbide epitaxial substrate, comprising:
a silicon carbide single crystal substrate having a main surface inclined relative to a {0001} plane by more than or equal to 1° and less than or equal to 8°; and
an epitaxial layer formed on the silicon carbide single crystal substrate,
trapezoidal defects disposed in a surface of the epitaxial layer, the trapezoidal defects, which are trapezoidal depressions, having a defect density of less than or equal to 1/cm²,
the trapezoidal defects each including an upper base portion and a lower base portion intersecting with a <11-20>direction when viewed in plan view,
the upper base portion having a width of more than or equal to 0.1 μm and less than or equal to 100 μm,
the lower base portion having a width of more than or equal to 50 μm and less than or equal to 5000 μm,
the upper base portion including a protruding portion,
the lower base portion including a plurality of step bunchings,
wherein the defect density of the trapezoidal defects is more than zero.

2. The silicon carbide epitaxial substrate according to claim 1, wherein the silicon carbide single crystal substrate has a diameter of more than or equal to 100 mm.

3. The silicon carbide epitaxial substrate according to claim 1, wherein the epitaxial layer has a thickness of more than or equal to 5 μm and less than or equal to 30 μm.

4. A silicon carbide epitaxial substrate, comprising:
a silicon carbide single crystal substrate having a main surface inclined relative to a {0001} plane by more than or equal to 1° and less than or equal to 8° and having a diameter of more than or equal to 100 mm; and
an epitaxial layer formed on the silicon carbide single crystal substrate and having a thickness of more than or equal to 5 μm and less than or equal to 30 μm,
trapezoidal defects disposed in a surface of the epitaxial layer, the trapezoidal defects, which are trapezoidal depressions, having a defect density of less than or equal to 1/cm²,
the trapezoidal defects each including an upper base portion and a lower base portion intersecting with a <11-20>direction when viewed in plan view,
the upper base portion having a width of more than or equal to 0.1 μm and less than or equal to 100 μm,
the lower base portion having a width of more than or equal to 50 μm and less than or equal to 5000 μm,
the upper base portion including a protruding portion,
the lower base portion including a plurality of step bunchings,
wherein the defect density of the trapezoidal defects is more than zero.

* * * * *